(12) United States Patent
Sato et al.

(10) Patent No.: US 9,276,406 B2
(45) Date of Patent: Mar. 1, 2016

(54) CONTROL DEVICE FOR POWER SUPPLY CIRCUIT

(75) Inventors: Kenji Sato, Shizuoka (JP); Seiko Suzuki, Shizuoka (JP)

(73) Assignee: SUZUKI MOTOR CORPORATION, Hamamatsu-Shi, Shizuoka (JP)

( * ) Notice: Subject to any disclaimer, the term of this patent is extended or adjusted under 35 U.S.C. 154(b) by 639 days.

(21) Appl. No.: 13/698,576

(22) PCT Filed: Apr. 27, 2011

(86) PCT No.: PCT/JP2011/060322
§ 371 (c)(1),
(2), (4) Date: Jan. 28, 2013

(87) PCT Pub. No.: WO2011/145447
PCT Pub. Date: Nov. 24, 2011

(65) Prior Publication Data
US 2013/0113290 A1    May 9, 2013

(30) Foreign Application Priority Data
May 18, 2010  (JP) .................... 2010-113955

(51) Int. Cl.
*H02J 1/10* (2006.01)
*H01M 2/34* (2006.01)
(Continued)

(52) U.S. Cl.
CPC ............... *H02J 1/10* (2013.01); *B60L 3/0046* (2013.01); *B60L 3/0069* (2013.01); *B60L 3/04* (2013.01);
(Continued)

(58) Field of Classification Search
CPC ....... H02J 1/10; H02J 7/0021; B60L 11/1803; B60L 3/04; B60L 11/1864; B60L 3/0046; B60L 11/1853; H01M 2/34; H01M 10/4207; H01M 10/482; H01M 2220/20; H02H 11/007; Y10T 307/696; G01R 31/362; G01R 31/3658; Y02T 10/7005
USPC ...................................................... 307/43, 80
See application file for complete search history.

(56) References Cited

U.S. PATENT DOCUMENTS 6,668,963 B2  12/2003 Nada
6,919,707 B2   7/2005 Kawai et al.
(Continued)

FOREIGN PATENT DOCUMENTS

| JP | 3409774 B2 | 5/2003 |
| JP | 2003209932 A | 7/2003 |
| JP | 2009232612 A | * 10/2009 |

OTHER PUBLICATIONS

International Search Report for PCT/JP2011/060322.
(Continued)

*Primary Examiner* — Hal Kaplan
(74) *Attorney, Agent, or Firm* — Troutman Sanders LLP (57) ABSTRACT

In a control device for a power supply circuit in which a plurality of high-voltage battery packs are provided, if any one of safety switch is off, the startup state of a high-voltage circuit is totally prevented, even when a careless mistake such as a careless power-on (ON) operation is made, the circuit is prevented from being started, and also the overall power supply is cut off by turning off (OFF) one safety switch, thereby improving the convenience of work. Voltage sensing units (9-1 to 9-*n*) that sense internal voltages are provided in battery packs (4-1 to 4-*n*) to detect a voltage change based on the operation of one or more safety switches (8-1 to 8-*n*) and maintain all relays (5-1 to 5-*n*) of the plurality of battery packs (4-1 to 4-*n*) provided in parallel in an open (OPEN) state.

4 Claims, 4 Drawing Sheets

(51) Int. Cl.
*B60L 3/00* (2006.01)
*B60L 3/04* (2006.01)
*B60L 11/18* (2006.01)
*H01M 10/42* (2006.01)
*H01M 10/48* (2006.01)
*H02J 7/00* (2006.01)
*H02H 11/00* (2006.01)
*G01R 31/36* (2006.01)

(52) U.S. Cl.
CPC ......... *B60L 11/1803* (2013.01); *B60L 11/1853* (2013.01); *B60L 11/1864* (2013.01); *H01M 2/34* (2013.01); *H01M 10/4207* (2013.01); *H01M 10/482* (2013.01); *H02H 11/007* (2013.01); *H02J 7/0021* (2013.01); *B60L 2240/547* (2013.01); *B60L 2240/549* (2013.01); *G01R 31/362* (2013.01); *G01R 31/3658* (2013.01); *H01M 2010/4278* (2013.01); *H01M 2220/20* (2013.01); *Y02T 10/7005* (2013.01); *Y02T 10/7055* (2013.01); *Y02T 10/7061* (2013.01); *Y10T 307/696* (2015.04)

(56) References Cited

U.S. PATENT DOCUMENTS

2002/0017405 A1 2/2002 Nada
2003/0129457 A1 7/2003 Kawai et al.

OTHER PUBLICATIONS

International Preliminary Report on Patentability, dated Dec. 10, 2012, which issued during the prosecution of International Patent Application PCT/JP2011/060322, which corresponds to the present application.

* cited by examiner

CONTROL DEVICE FOR POWER SUPPLY CIRCUIT

CROSS-REFERENCE TO RELATED APPLICATIONS

This is a U.S. national phase application under 35 U.S.C. §371 of International Patent Application No. PCT/JP2011/060322, filed on Apr. 27, 2011, and claims benefit of priority to Japanese Patent Application No. 2010-113955, filed on May 18, 2010. The International Application was published on Nov. 24, 2011 as International Publication No. WO/2011/145447 under PCT Article 21(2). The entire contents of these applications are hereby incorporated herein by reference.

TECHNICAL FIELD

The present invention relates to a control device for a power supply circuit and, in particular, to a control device for a power supply circuit managing a power supply and cut state in a power supply circuit provided in an electric propulsion unit installed in vehicles such as electric automobile, hybrid vehicle and the like.

BACKGROUND ART

In recent years, environmentally-friendly vehicles such as hybrid automobile, electric automobile, and fuel cell automobile draw attention. In the environment-responsive vehicles, a battery for supplying driving power to a driving motor being a power source is installed.

In such vehicle including the battery, as means for keeping a maximum output of the battery and extending the running distance when traveling only by the power of the battery, it is examined to install a plurality of batteries to increase the capacity of the battery.

In general, the battery is provided with a safety switch for breaking a high-voltage circuit and ensuring the safety at work when performing maintenance and the like. Performance of operation of turning off the safety switch opens (OPEN) the relay (main relay) and therefore breaks the high-voltage circuit. Similarly, also by performing operation of turning off (OFF) the ignition switch, the relay is opened (OPEN) to break the high-voltage circuit.

For example, even when an operator performs ON operation of the ignition switch by mistake during high voltage work, the high-voltage circuit can be broken when the safety switch is OFF.

A power supply control device, a method of starting a vehicle and a method of using a high-voltage power supply according to Patent Document 1 use, in a vehicle including a high-voltage power supply (battery), a power supply including a breaking member artificially breaking on the power supply side the output of the high-voltage power supply, in which a plurality of battery packs connected in series are installed and when a safety plug (safety switch) provided in any one of the battery packs is opened, the whole circuit is opened, and closure of a relay contact is inhibited upon detection of operation of the breaking member and then the inhibition is released especially upon detection of a drive operation.

CITATION LIST

Patent Literature

Patent Literature 1: Japanese Patent No. 3409774

SUMMARY OF INVENTION

Technical Problem

However, in the vehicle including a plurality of batteries, there is inconvenience that when the ON operation of the ignition switch is performed by mistake, a high-voltage circuit is formed unless all of the safety switches are off.

More specifically, in the case where the plurality of battery packs connected in parallel are installed as in the above Patent Document 1, even when a safety plug (safety switch) provided in any one of the battery packs is opened, a closed circuit can be formed if a safety plug (safety switch) provided in another battery pack is closed (CLOSE).

This is considered to be advantageous in maximizing the power stored in the battery packs, while causing inconvenience of increasing the risk such as short circuit, electrical shock in terms of service work.

Hence, an object of the present invention is to provide a control device for a power supply circuit, which reduces the work risk in a service work or the like at a plurality of battery packs connected in parallel.

Solution to Problem

The present invention is a control device for a power supply circuit in which a plurality of high-voltage battery packs including safety switches are provided and connected to be parallel with each other, and relays capable of cutting off power supply from the battery packs are provided and opened based on an operation of the safety switches, wherein the battery pack includes a voltage sensing unit that senses an internal voltage to detect a voltage change based on the operation of one or more safety switches among the plurality of safety switches and maintain all of the relays in an open state.

Advantageous Effects of Invention

The control device for a power supply circuit of the present invention can reduce the work risk in a service work or the like in a plurality of battery packs connected in parallel.

DESCRIPTION OF EMBODIMENTS

The present invention realizes the object to reduce the work risk in a service work or the like in a plurality of battery packs connected in parallel, by detecting a voltage change based on an operation of one or more safety switches and maintaining all relays of the plurality of battery packs provided in parallel in an open state.

Example 1

Figure 1:
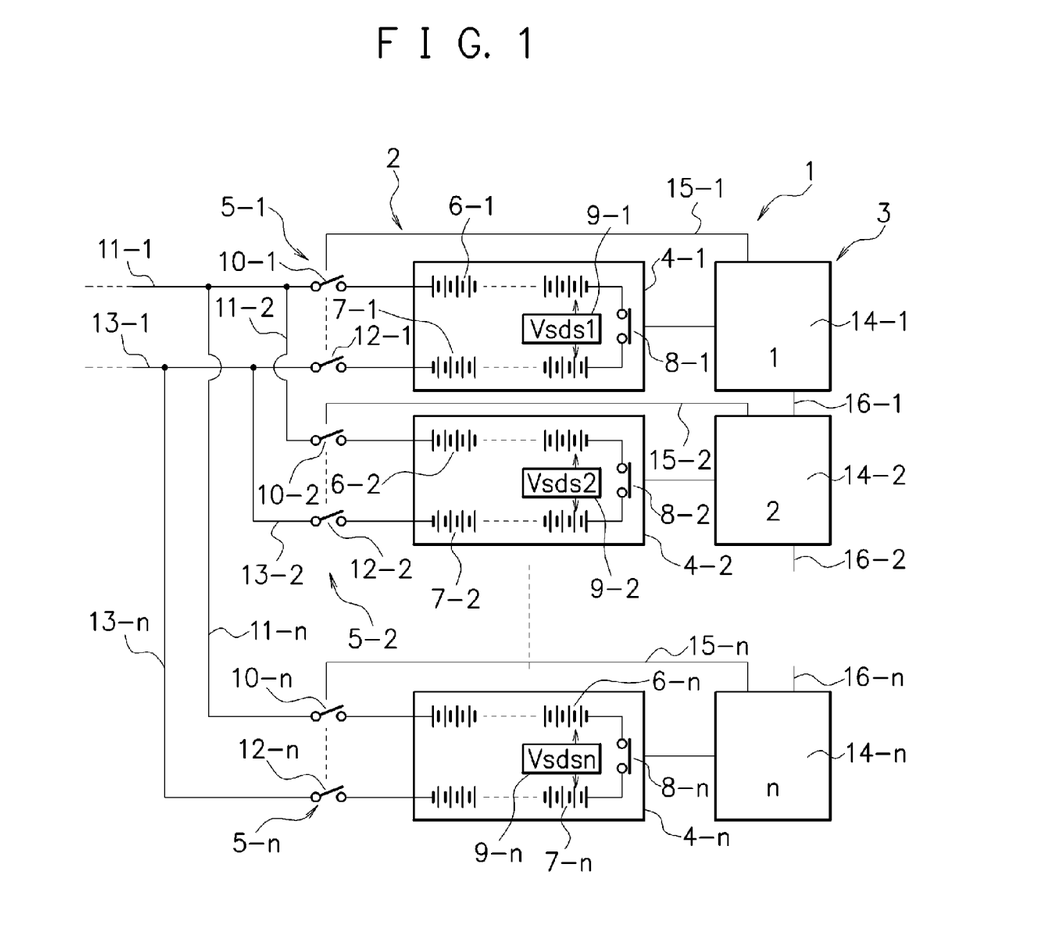
FIG. 1 is a system configuration diagram of sensing by a voltage change using circuits monitoring cell voltages including safety switches, according to an example 1 of the present invention.
Figure 2:
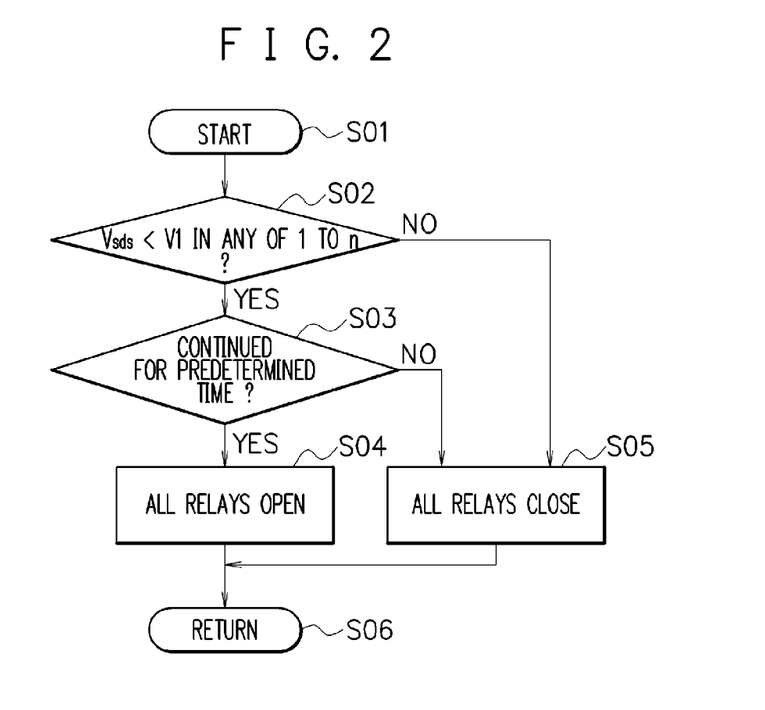
FIG. 2 is a flowchart of sensing by a voltage change using the circuits monitoring the cell voltages including the safety switches, according to the example 1 of the present invention.
Figure 3:
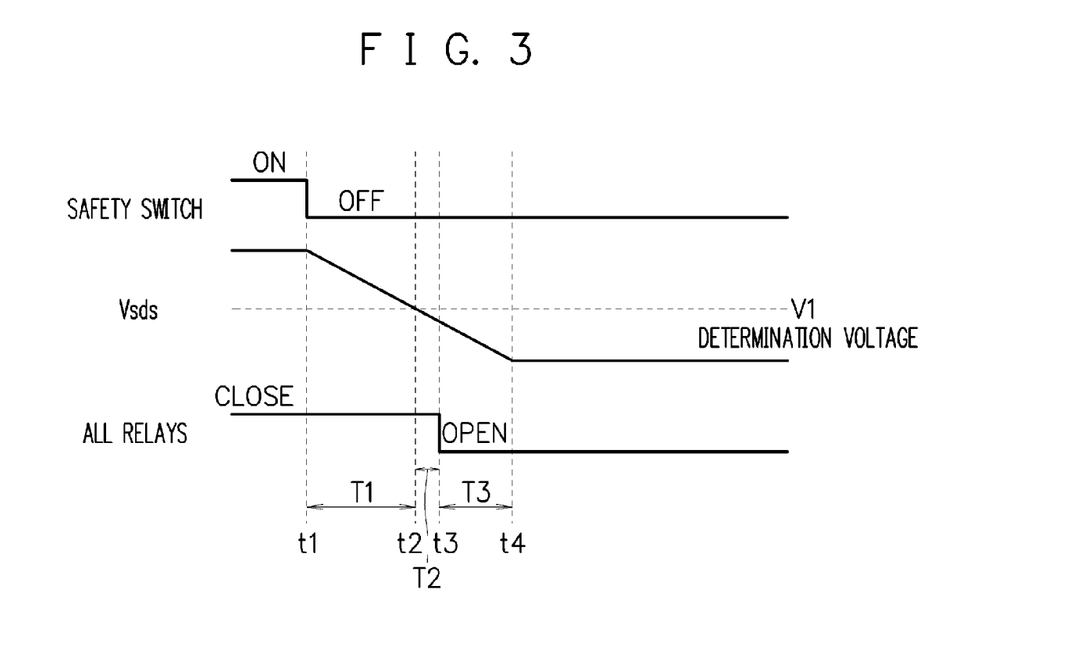
FIG. 3 is a time chart of sensing by a voltage change using the circuits monitoring the cell voltages including the safety switches, according to the example 1 of the present invention.

FIG. 1 to FIG. 3 illustrate an example 1 of the present invention.

In FIG. 1, numeral 1 denotes an electric propulsion unit installed in a vehicle such as an electric automobile, a hybrid vehicle or the like. In the electric propulsion unit 1, a power supply circuit 2 and an electronic control device 3 are provided.

The power supply circuit 2 is provided with a plurality of first to n-th battery packs 4-1 to 4-n, as high-voltage battery packs, such that the first to n-th battery packs 4-1 to 4-n are connected in parallel with each other, and provided with first to n-th relays (main relays) 5-1 to 5-n which can cut off the power supply from the first to n-th battery packs 4-1 to 4-n.

The first battery pack 4-1 includes a plurality of first positive electrode side battery cells (unit batteries) 6-1 which are connected in series with each other, and a plurality of first negative electrode side battery cells (unit batteries) 7-1 which are connected in parallel with the first positive electrode side battery cells 6-1 and connected in series with each other. The first battery pack 401 further includes a first safety switch 8-1 that communicates with the first positive electrode side battery cells 6-1 and the first negative electrode side battery cells 7-1, and a first voltage detection unit 9-1 that detects a first internal voltage (cell voltage) Vsds1.

With the first positive electrode side battery cells 6-1, a first positive electrode side bus (busbar) 11-1 communicates, which is connected to a device such as an inverter and includes a first positive electrode side relay 10-1 in a first relay 5-1. With the first negative electrode side battery cells 7-1, a first negative electrode side bus (busbar) 13-1 communicates, which is connected to the device such as an inverter and includes a first negative electrode side relay 12-1 in the first relay 5-1.

The second battery pack 4-2 includes a plurality of second positive electrode side battery cells (unit batteries) 6-2 which are connected in series with each other, and a plurality of second negative electrode side battery cells (unit batteries) 7-2 which are connected in parallel with the second positive electrode side battery cells 6-2 and connected in series with each other. The second battery pack 4-2 further includes a second safety switch 8-2 that communicates with the second positive electrode side battery cells 6-2 and the second negative electrode side battery cells 7-2, and a second voltage detection unit 9-2 that detects a second internal voltage (cell voltage) Vsds2.

With the second positive electrode side battery cells 6-2, a second positive electrode side bus (busbar) 11-2 communicates, which is connected to the first positive electrode side bus 11-1 and includes a second positive electrode side relay 10-2 in a second relay 5-2. With the second negative electrode side battery cells 7-2, a second negative electrode side bus (busbar) 13-2 communicates, which is connected to the first negative electrode side bus 13-1 and includes a second negative electrode side relay 12-2 in the second relay 5-2.

The n-th battery pack 4-n includes a plurality of n-th positive electrode side battery cells (unit batteries) 6-n which are connected in series with each other, and a plurality of n-th negative electrode side battery cells (unit batteries) 7-n which are connected in parallel with the n-th positive electrode side battery cells 6-n and connected in series with each other. The n-th battery pack 4-n further includes an n-th safety switch 8-n that communicates with the n-th positive electrode side battery cells 6-n and the n-th negative electrode side battery cells 7-n, and an n-th voltage detection unit 9-n that detects an n-th internal voltage (cell voltage) Vsdsn.

With the n-th positive electrode side battery cells 6-n, an n-th positive electrode side bus (busbar) 11-n communicates, which is connected to the first positive electrode side bus 11-1 and includes an n-th positive electrode side relay 10-n in an n-th relay 5-n. With the n-th negative electrode side battery cells 7-n, an n-th negative electrode side bus (busbar) 13-n communicates, which is connected to the first negative electrode side bus 13-1 and includes an n-th negative electrode side relay 12-n in the n-th relay 5-n.

The electronic control device 3 includes a plurality of first to n-th control devices 14-1 to 14-n that communicate with the first to n-th battery packs 4-1 to 4-n. The first to n-th control devices 14-1 to 14-n are connected to the first to n-th relays 5-1 to 5-n via first to n-th communication electric wires 15-1 to 15-n. Further, the first to n-th control devices 14-1 to 14-n are directly connected with each other through first to n-th communication lines 16-1 to 16-n and communicate with each other.

The first to n-th control devices 14-1 to 14-n constitute a system for sensing by a change in voltage using circuits that monitor the internal voltages (cell voltages) (Vsds1 to Vsdsn) (V) including the safety switches (8-1 to 8-n), for each of the battery packs (4-1 to 4-n), and control OPEN/CLOSE of the first to n-th relays 5-1 to 5-n based on operation of the first to n-th safety switches 8-1 to 8-n.

The electronic control device 3 is configured such that the first control device 14-1 communicating with one battery pack, for example, the first battery pack 4-1 operates to transmit its own internal voltage (cell voltage) information (vsds1) to the other second to n-th control devices 14-2 to 14-n communicating with the second to n-th battery packs 4-2 to 4-n and receive second to n-th voltage information Vsds2 to Vsdsn from the second to n-th control devices 14-2 to 14-n. All of the second to n-th control devices 14-2 to 14-n operate similarly to the first control device 14-1.

The first to n-th control devices 14-1 to 14-n detect a voltage change based on operation of one or more safety switches among the first to n-th safety switches 8-1 to 8-n and maintain all of the first to n-th relays 5-1 to 5-n for the plurality of first to n-th battery packs 4-1 to 4-n provided in parallel in an open state.

In the sensing through the voltage change using circuits monitoring the cell voltages including the safety switches in determination on the safety switches of a vehicle in which a plurality of battery packs according to the example 1 are installed in parallel, the circuits are provided in a number corresponding to the number of the safety switches (8-1 to 8-n) and configured to recognize that the safety switches (8-t to 8-n) are turned off (OFF) by the fact that the internal voltages vsds (V) including the safety switches (8-1 to 8-n) become less than a determination voltage V1 (V) for a predetermined time (determination time: t1 (s)) or more, and open (OPEN) all of the relays (5-1 to 5-n), irrespective of the condition that the relays (5-1 to 5-n) are opened (OPEN) or closed (CLOSE). They are configured to prevent all of the relays (5-1 to 5-n) from being closed (CLOSE) also when they recognize that the safety switches (8-1 to 8-n) are turned off (OFF) before the relays (5-1 to 5-n) are turned on.

This ensures that even when the operator performs ON operation of the ignition switch by mistake during high voltage work, the high-voltage circuit is broken if one safety switch among the plurality of safety switches (8-1 to 8-*n*) is off.

Next, the sensing through the voltage change using the circuits monitoring the internal voltages (cell voltages) including the safety switches will be described based on a flowchart in FIG. 2.

As illustrated in FIG. 2, after a program is started (step S01), the electronic control device 3 determines whether the state of the internal voltage (cell voltage) Vsds<the determination voltage (V1) is established in any of the first to n-th battery packs 4-1 to 4-*n* (step S02).

When YES at step S02, the electronic control device 3 determines whether the state has continued for a predetermined time (determination time) (s) (step S03).

When YES at step S03, the electronic control device 3 opens (OPEN) all of the relays (5-1 to 5-*n*) (step S04).

On the other hand, when NO at step S02 and NO at step S03, the electronic control device 3 closes (CLOSE) all of the relays (5-1 to 5-*n*) (step S05).

After the processing at step S04 or after the processing at step S05, the electronic control device 3 returns the program (step S06).

Subsequently, the sensing through the voltage change using the circuits monitoring the internal voltages (cell voltages) including the safety switches will be described based on a time chart in FIG. 3.

As illustrated in FIG. 3, in the state that all of the relays (5-1 to 5-*n*) are in a closed (CLOSE) state, when the safety switch (8-1 to 8-*n*) is switched from ON to OFF (time t1), the internal voltage (cell voltage) (Vsds) starts to decrease. Then, when the internal voltage (Vsds) decreases to a determination voltage (V1) after a lapse of a first time T1 from the time when the safety switch (8-1 to 8-*n*) is switched from ON to OFF (time t1) (time t2), and a second time (T2) (s) as a predetermined time (determination time) continues from the time when the internal voltage (Vsds) has decreased to the determination voltage (V1) (time t2) (time t3), all of the relays (5-1 to 5-*n*) are opened (OPEN) to break the high-voltage circuit, the internal voltage (Vsds) thereafter continues to decrease, and the internal voltage (Vsds) become zero upon a lapse of a third time T3 (time t4).

In the case where the safety switches (8-1 to 8-*n*) are turned off (OFF) at time t3 when the relays (5-1 to 5-*n*) are opened (OPEN), if the internal voltage equal to or less than the determination voltage (V1) continues for the second time T2, which is the predetermined time, or more from time t2, the relays (5-1 to 5-*n*) are kept opened (OPEN) and not closed (CLOSE) also after time t3.

Note that though the internal voltage (Vsds) has a gradient from time t1 to time t4 to have an attenuation time in FIG. 3, it is also adoptable that the internal voltage (Vsds) is actually zero without the attenuation time or it is also possible to intentionally change the predetermined time T2.

As a result of this, the voltage change based on the operation of one or more safety switches is detected and all of the relays (5-1 to 5-*n*) in the plurality of battery packs (4-1 to 4-*n*) provided in parallel are maintained in an open (OPEN) state, so that as long as one of the safety switches (8-1 to 8-*n*) is off, the startup state of the high-voltage circuit is totally prevented, and the circuit is prevented from being started even when a careless mistake such as a careless power ON operation is made. Further, the overall power supply is cut off by turning off (OFF) one of the safety switches (8-1 to 8-*n*), thereby improving the convenience of work.

Further, the first to n-th voltage detection units 9-1 to 9-*n* serve also as partial voltage detection units detecting voltages of partial circuits including the safety switches (8-1 to 8-*n*). In other words, the battery packs (4-1 to 4-*n*) include the partial voltage detection units (9-1 to 9-*n*) respectively, so that when the state that the partial voltage does not exceed the determination voltage V1 continues for the predetermined time (determination time: T2), all of the relays (5-1 to 5-*n*) are maintained in an open state, thereby making it possible to surely sense the states of the safety switches (8-1 to 8-*n*) by detecting only the partial voltages of the battery packs (4-1 to 4-*n*) and thus simplify the circuit configuration.

Furthermore, the plurality of battery packs (4-1 to 4-*n*) provided in parallel communicate with the control devices (14-1 to 14-*n*) respectively and communicate the own and other voltage information (Vsds) to each other, thereby facilitating the change in the total number of battery packs (4-1 to 4-*n*) as compared to the case by a single control device and enabling option setting for vehicles with various capacities.

Example 2

Figure 4:
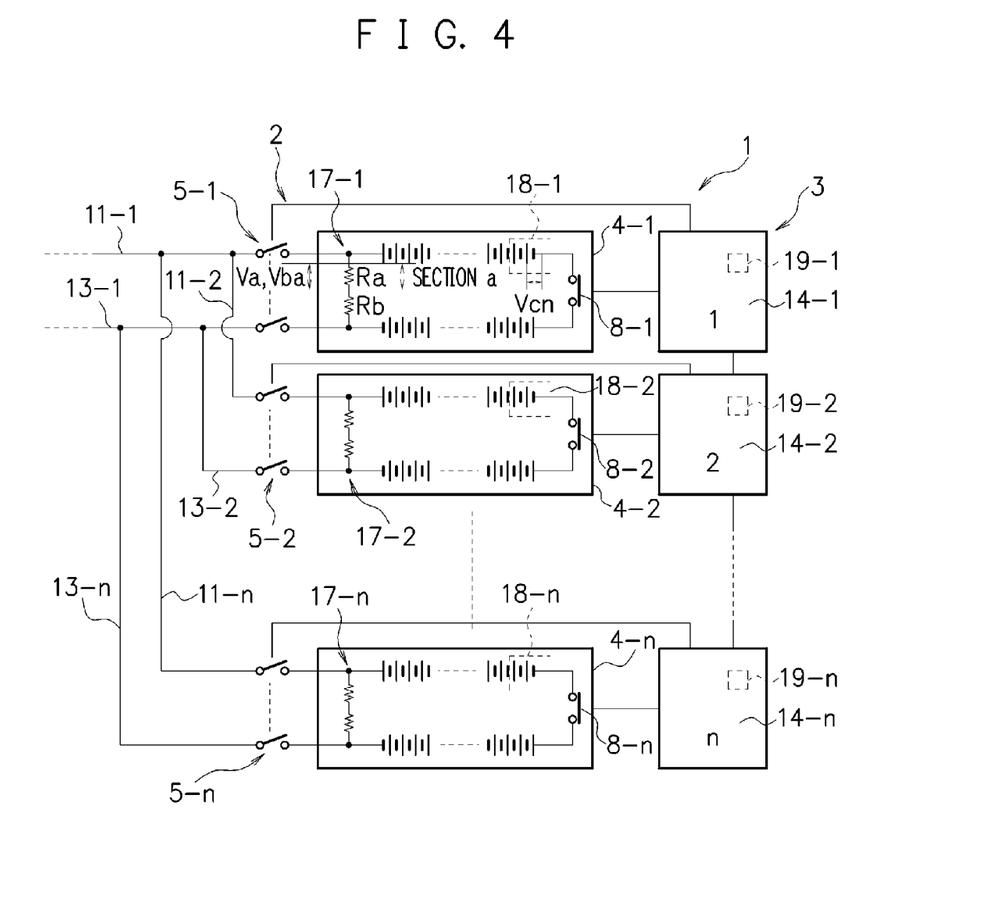
FIG. 4 is a configuration diagram of a sensing system by a voltage change using circuits existing in a battery total voltage, according to an example 2 of the present invention.
Figure 5:
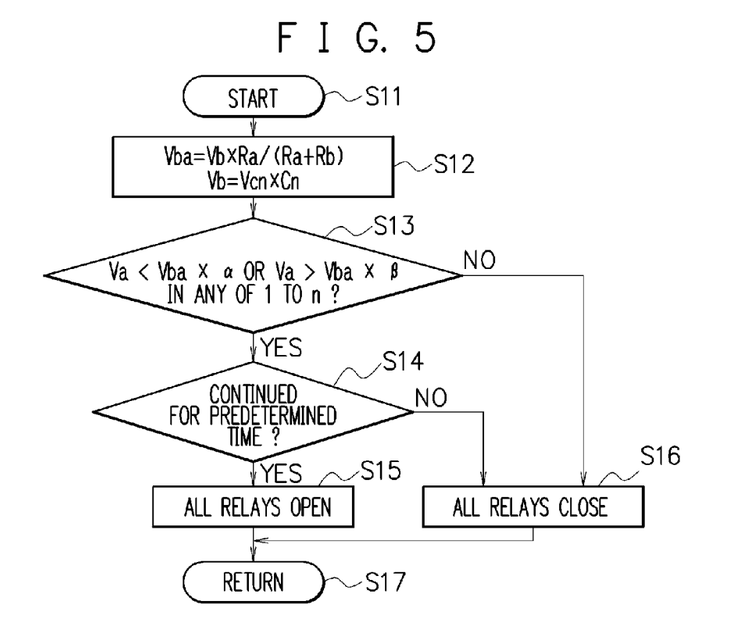
FIG. 5 is a flowchart in the sensing system by a voltage change using the circuits existing in the battery total voltage, according to the example 2 of the present invention.
Figure 6:
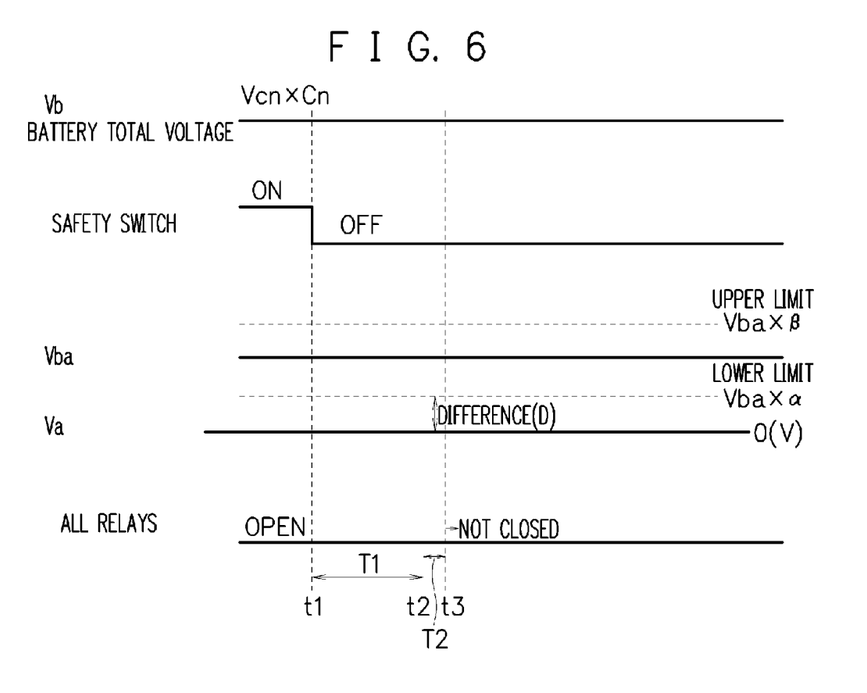
FIG. 6 is a time chart in the sensing system by a voltage change using the circuits existing in the battery total voltage, according to the example 2 of the present invention.

FIG. 4 to FIG. 6 illustrate an example 2 of the present invention.

The example 2 will be described by giving the same numerals to the portions serving as the same functions as those in the above-described example 1.

The features of the example 2 are the followings. Specifically, the structure is configured such that, as illustrated in FIG. 4, in the sensing through the voltage change using circuits existing in a battery total voltage in determination on the safety switches of an automobile in which a plurality of battery packs are installed in parallel, a measurement voltage Va (V) across a section a (a portion corresponding to a resistor Ra) of the existing circuit is compared to a voltage Vba (V) across the section a calculated from a total voltage Vb (V) across the battery cells, under the condition that the relays (5-1 to 5-*n*) are opened (OPEN), and the fact that one of the plurality of safety switches is turned off is recognized by occurrence of a difference (D) between both the voltages for a predetermined time (determination time) (s) or more, thereby preventing all of the relays (5-1 to 5-*n*) from being closed (CLOSE).

Therefore, the first to n-th battery packs 4-1 to 4-*n* include first to n-th actual total voltage detection units 17-1 to 17-*n* detecting the actual total voltages, and first to n-th actual partial voltage detection units 18-1 to 18-*n* detecting the actual partial voltages of the partial circuits as illustrated in FIG. 4.

The first to n-th control devices 14-1 to 14-*n* also include first to n-th partial voltage calculation units 19-1 to 19-*n* calculating the partial voltages of the partial circuits from the actual total voltage detected by the first to n-th actual total voltage detection units 17-1 to 17-*n*. When the state that the first to n-th actual partial voltage detected by the first to n-th actual partial voltage detection unit 18-1 to 18-*n* falls outside a determination voltage range (between an error coefficient lower limit value (Vba×α) and an error coefficient upper limit value (Vba×β) illustrated in FIG. 6) corresponding to a predetermined range of the actual partial voltage calculated by the partial voltage calculation unit 19-1 to 19-*n* continues for a predetermined time (indicated by T2 in FIG. 6), all of the relays (5-1 to 5-*n*) are maintained in an open state.

In FIG. 4, the measurement voltage Va across the section a in the existing circuit including the resistor Ra and a resistor Rb and the voltage Vba across the section a calculated from the battery total voltage Vb are being monitored.

The voltage Vba across the section a calculated from the battery total voltage Vb is calculated by the following formula.

$$Vba = Vb \times Ra/(Ra+Rb)$$

The battery total voltage Vb is calculated by the following formula to be the sum of the cell voltages.

$$Vb = Vcn \times Cn$$

where
Vcn: voltage of a cell
Cn: the number of cells in each battery.

Further, the turning off of the safety switch (8-1 to 8-*n*) is detected by the following formulas.

$$Va < Vba \times \alpha$$

$$Va > Vba \times \beta$$

where
Va: measurement voltage (V) across the section a
Vba: voltage (V) across the section a calculated from Vb
α: error coefficient lower limit value (0<α<1)
β: error coefficient upper limit value (1<β<2).

Further, when Vba (the voltage across the section a calculated from Vb) falls in a range between the error coefficient lower limit value (Vba×α) and the error coefficient upper limit value (Vba×β), the safety switches (8-1 to 8-*n*) are maintained ON.

Next, the sensing through the voltage change using the circuits in the battery total voltage will be described based on a flowchart in FIG. 5.

As illustrated in FIG. 5, after a program is started (step S11), the electronic control device 3 calculates the battery total voltage Vb that is found from the sum of the cell voltages, and the voltage Vba across the section a found from the battery total voltage Vb.

More specifically, the battery total voltage (Vba) is found from the following formula, $$Vba = Vb \times Ra/(Ra+Rb)$$

and Vb is found from the following formula (step S12).

$$Vb = Vcn \times Cn$$

Then, the electronic control device 3 determines whether the state of Va<Vba×α or Va>Vba×β is established in any of the first to n-th battery packs 4-1 to 4-*n*, that is, compares the voltage value obtained by multiplying Vba by the error coefficient (α, β) with the measurement voltage Va across the section a (step S13).

When YES at step S13, the electronic control device 3 determines whether the state has continued for a predetermined time (determination time) (step S14).

When YES at step S14, the electronic control device 3 opens (OPEN) all of the relays (5-1 to 5-*n*) (step S15).

On the other hand, when NO at step S13 or NO at step S14, the electronic control device 3 closes (CLOSE) all of the relays (5-1 to 5-*n*) (step S16).

After the processing at step S15 or after the processing at step S16, the electronic control device 3 returns the program (step S17).

Subsequently, the sensing through the voltage change using the circuits existing in the battery total voltage will be described based on a time chart in FIG. 6.

As illustrated in FIG. 6, in the state that all of the relays (5-1 to 5-*n*) are in an open (OPEN) state, when the battery total voltage Vb is at the predetermined value (Vcn×Cn), the safety switch (8-1 to 8-*n*) is switched from ON to OFF (time t1), the first time T1 has passed (time t2), thereafter the state of Va<Vba×α or Va>Vba×β is confirmed until the second time T2 as the predetermined time (determination time) elapses (time t3), and Vba falls within this range, the relays (5-1 to 5-*n*) are not closed (CLOSE) but opened (OPEN) to break the high-voltage circuit.

In FIG. 6, Vb is calculated from the sum of the internal voltages (cell voltages) of the battery packs (4-1 to 4-*n*), and is therefore constant irrespective of time. Further, Vba calculated from Vb is constant irrespective of time.

As described above, even when only one safety switch is turned off, the change in the internal voltage is sensed to open (OPEN) all of the relays (5-1 to 5-*n*) to enable breakage of the high-voltage circuit.

Consequently, the states of the safety switches (8-1 to 8-*n*) can be accurately sensed by detection of the partial voltages based on the total voltage of the battery packs (4-1 to 4-*n*), whereby the circuit configuration can impart the degree of freedom to the determination accuracy.

Further, the plurality of battery packs (4-1 to 4-*n*) provided in parallel communicate with the control devices (14-1 to 14-*n*) respectively and communicate the own and other voltage information (Vsds) to each other. This facilitates the change in the total number of battery packs (4-1 to 4-*n*) as compared to the case by a single control device and enables option setting for vehicles with various capacities.

INDUSTRIAL APPLICABILITY

The control device of the power supply circuit according to the present invention is applicable to various kinds of vehicles.

The invention claimed is:
1. A control device for a power supply circuit comprising:
a plurality of high-voltage battery packs connected in parallel with each other, comprising:
a plurality of safety switches; and
a partial voltage detector, included in each of said battery packs, detecting a partial voltage of a partial circuit including said safety switch; and
a plurality of relays capable of cutting off power supply from said battery packs provided and opened based on an operation of said safety switches,
wherein when the partial voltage detected by said partial voltage detector does not exceed a predetermined determination voltage for a predetermined time, all of said relays are maintained in an open state.
2. The control device for a power supply circuit according to claim 1,
wherein said plurality of battery packs communicate with respective control devices, and said control devices communicate with each other and communicate own and other voltage information to each other.
3. A control device for a power supply circuit comprising:
a plurality of high-voltage battery packs connected in parallel with each other, comprising:
a plurality of safety switches;
an actual total voltage detector, included in each of said battery packs, detecting an actual total voltage,
an actual partial voltage detector detecting an actual partial voltage of a partial circuit, and
a partial voltage calculator calculating the partial voltage of said partial circuit from the actual total voltage detected by said actual total voltage detector; and
a plurality of relays capable of cutting off power supply from said battery packs provided and opened based on an operation of said safety switches, wherein when a state that the actual partial voltage detected by said actual partial voltage detector falls outside a determination voltage range corresponding to a predetermined range of the actual partial voltage calculated by said partial voltage calculator continues for a predetermined time, all of said relays are maintained in an open state.

4. The control device for a power supply circuit according to claim 3, wherein said plurality of battery packs communicate with each other and communicate own and other voltage information to each other.

* * * * *